(12) United States Patent
Lu (10) Patent No.: US 6,810,094 B1
(45) Date of Patent: Oct. 26, 2004

(54) VITERBI DECODER WITH PIPELINED PARALLEL ARCHITECTURE

(75) Inventor: Mingying Lu, Maidenhead (GB)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/263,886

(22) Filed: Mar. 8, 1999

(30) Foreign Application Priority Data

Mar. 12, 1998 (EP) .............................. 98301826

(51) Int. Cl.$^7$ .............................................. H03D 1/00
(52) U.S. Cl. ...................... 375/341; 375/262; 375/265
(58) Field of Search ................. 375/341, 262, 375/265, 340

(56) References Cited

U.S. PATENT DOCUMENTS

| | | | | |
|---|---|---|---|---|
| 4,677,625 A | * | 6/1987 | Betts et al. .................... | 341/81 |
| 5,027,374 A | | 6/1991 | Rossman ...................... | 375/94 |
| 5,220,570 A | | 6/1993 | Lou et al. ...................... | 371/43 |
| 5,349,608 A | | 9/1994 | Graham et al. ................ | 375/94 |
| 5,412,669 A | | 5/1995 | Foland, Jr. .................... | 371/43 |
| 5,414,738 A | * | 5/1995 | Bienz .......................... | 375/341 |
| 5,432,803 A | * | 7/1995 | Liu et al. ...................... | 375/340 |
| 5,483,554 A | * | 1/1996 | Chauvel et al. ............. | 375/303 |
| 5,633,897 A | | 5/1997 | Fettweis et al. ............ | 375/341 |
| 5,708,797 A | * | 1/1998 | Kobayashi ................... | 711/173 |
| 5,844,946 A | * | 12/1998 | Nagayasu ................... | 375/341 |
| 5,907,586 A | * | 5/1999 | Katsuragawa et al. ...... | 370/342 |
| 6,222,889 B1 | * | 4/2001 | Lee ............................. | 375/265 |
| 6,302,576 B1 | * | 10/2001 | Ono et al. ................... | 375/262 |

FOREIGN PATENT DOCUMENTS

| | | |
|---|---|---|
| EP | 0 458 229 | 11/1991 |
| EP | 0 653 847 | 5/1995 |
| WO | WO96/31953 | 10/1996 |

OTHER PUBLICATIONS

Paaske E et al.: *An Area–Efficient Path Memory Structure for VLSI Implementation of High Speed Viterbi Decoders*, Integration, The VLSI Journal, vol. 12, No. 1, Nov. 1, 1991, pp. 79–91.

* cited by examiner

Primary Examiner—Temesghen Ghebretinsae
Assistant Examiner—Pankaj Kumar
(74) Attorney, Agent, or Firm—Kenyon & Kenyon (57) ABSTRACT

A Viterbi decoder comprises a COFDM modulator, depuncture unit, a branch metrics unit an add-compare-select unit, memory, a best path unit, an error unit and a sequential controller for controlling the operation of the other units. The add-compare-select unit processes path metrics for pairs of states in parallel using a pipeline architecture. The add-compare-select unit also processes path data for pairs of states in parallel using a pipeline architecture. The best path select unit identifies the lowest cost surviving path which is in one frame and outputs a path data bit, produced a predetermined number of frames earlier, as decoded data.

18 Claims, 4 Drawing Sheets

VITERBI DECODER WITH PIPELINED PARALLEL ARCHITECTURE

FIELD OF THE INVENTION

The present invention relates to Viterbi decoding.

BACKGROUND TO THE INVENTION

Viterbi decoders find many applications. One such application is in baseband decoders for European digital audio broadcast (DAB) receivers. DAB services are transmitted using a frame structure in which individual services use one or more of six subframes of a frame. A problem arises because decoders suitable for consumer equipment cannot decode all six subframes thereby limiting the available equipment to the reception of one service at a time and preventing the use of a whole frame for one high bandwidth service.

DAB services are transmitted using a convolution code, having a 7-bit constraint length, to form four polynomial codes. The decoding process is computationally intensive, typically requiring 328 DSP (digital signal processor) instructions for a one bit decoder. This is because, in order to decode the 7-bit constraint length convolution code used for DAB, processing is required for 64 states. The processing of each state requires the following stages: adding two new branch metrics to an existing path metric; identify best of the two new branch metrics; selecting the best new branch metric as the surviving path; and tracing back the surviving path.

A full-rate DAB decoder, i.e. one for decoding all of the subframes in real time, must operate at a speed of 1.9 Mbits/s, requiring operation at 623 MIPs by the DSP.

The use of Viterbi decoding of convolution coded data is described in general in Halsall, F., "Data Communications, Computer Network and Open Systems", ISBN 0-201-42293-X.

Viterbi decoding comprises processing of path metrics and processing of path history data. This data is typically stored in RAM.

SUMMARY OF THE INVENTION

It is an object of the present invention to provided an improved Viterbi decoder.

It is a further object of the present invention to provide a Viterbi decoder having an increased data throughput.

It is yet a further object of the present invention to provide a Viterbi decoder which makes efficient use of silicon possible.

According to the present invention, there is provided a Viterbi decoder including memory means for storing Viterbi decoder data, comprising path metrics and/or path history data, clocked processing means for producing new Viterbi decoder data from Viterbi decoder data read from the memory means and a signal being decoded, and addressing means for addressing the memory means, wherein the memory means comprises two-port RAM means and the addressing means is configured such that Viterbi decoder data is always read from the memory means in the same state order and the addressing of the memory means for writing Viterbi data follows the same sequence as the read addressing but lags by the maximum number of control clock cycles taken between reading Viterbi data and storing of the resultant new Viterbi data. The use of the same addresses for reading and then, a predetermined period later, writing data means that the address sequence used cycles through a series of permutations, changing with each frame, so that the data is always read in a constant state order.

The particular addressing arrangement of the present invention means that two-port RAMs can be employed, resulting in a significant reduction in the amount of memory required. When the present invention is embodied in an integrated circuit, there is also a significant reduction in the area of silicon required.

Preferably, the memory means comprised first and second two-port RAM means and the addressing means is arranged for reading two path metrics or history data for two paths concurrently from respectively the first and second RAM means. More preferably, an address signal applied to the first RAM means is concurrently applied to the second RAM means. The first and second two-port RAM means may be embodied in a single RAM structure. Since the same address signals are applied concurrently to both RAM means, one RAM means can be embodied in the cells for the most significant bits and the other RAM means can be embodied in the cells for the least significant bits. For example, if each RAM means must store an 11-bit word, a single RAM that stores 22-bit words can be used. In this case, the first RAM means may comprise the cells for the 11 most significant bits and the second RAM means may comprise the cells for the 11 least significant bits.

In a preferred embodiment, the memory means comprises four two-port RAM means, two of which store path metric data and two of which store path history data. The four two-port RAM means may be embodied in a single two-port RAM structure.

According to the present invention, there is also provided a method of Viterbi decoding comprising the steps of: (a) obtaining two path metrics, the path metrics being associated with states that can be followed by the same set of states; (b) modifying said path metrics with branch metrics to produce a first pair of new path metrics for a first member of said set and a second pair of path metrics for a second member of said set, the members of each pair being derived respectively from said two path metrics; and (c) selecting the lower cost path metric of each pair.

Preferably, step (a) is performed while step (b) is being performed in respect of two path metrics obtained by an earlier performance of step (a). In other words, the processing of path metrics is pipelined.

Preferably, step (b) comprises adding a branch metric to each of said two path metrics and subtracting the same branch metric from each of said two path metrics. This may be applied cases where there is a degree of symmetry inherent in the convolution code being decoded.

Preferably, the selected path metrics are stored in a memory means from which at least one of said two path metrics was read. More preferably, selected path metrics are written to respective RAM means in dependence on the most significant bits of the binary representations of the states to which the selected path metrics relate.

Preferably, the reading of path metrics is arranged such that a first performance of step (a) and a second immediately following performance of step (a) leads to a pair of selected path metrics to be stored in one of said RAM means and a pair of selected path metrics to be stored in the other of said RAM means, and each member of one of the pairs of selected path metrics is stored concurrently with a member of the other pair of selected path metrics.

According to the present invention, there is also provided Viterbi decoder comprising first processing means for concurrently modifying two path metrics using at least one branch metric to produce a pair of new path metrics for each of two branched to states, and second processing means for concurrently processing pairs of new path metrics, produced by the first processing means, to select from each pair a path metric for a surviving path.

Preferably, there is provided memory means for storing path metrics and addressing means for reading two path metrics from the memory means, the path metrics being associated with states that can be followed by the same set of states, wherein the first processing means is arranged to process path metrics read from the memory means by means of the addressing means.

Preferably, the first processing means comprises an first adder for adding a branch metric to a first path metric read from the memory means, a second adder for adding a branch metric to a second path metric read from the memory means, a first subtracter for subtracting a branch metric from said first path metric and a second subtracter for subtracting a branch metric from said second path metric.

More preferably, the same branch metric is applied to the first and second adders and the first and second subtracters.

Preferably, the second processing means is arranged to output said selected path metrics to the memory means.

Preferably, the memory means comprises first and second RAM means and the second processing means is arranged such that said selected path metrics are output to one or other of the RAM means in dependence on values of the most significant bits of the binary representations of their associated states. More preferably, the first and second RAM means comprise two-port RAM means and the addressing means is arranged for reading said two path metrics from respectively the first and second RAM means. Conveniently, an address signal applied to the first RAM means is concurrently applied to the second RAM. The use of two-port RAM means with the preferred addressing arrangement reduces the amount of RAM that must be provided vis-à-vis the prior art.

Preferably, the addressing means is configured such that path metrics are always read from the memory means in the same order and the addressing of the memory means for writing surviving path metrics follows the same sequence as the read addressing but lags by the maximum number of control clock cycles taken between reading two path metrics and storing of the resultant surviving path metrics.

According to the present invention, there is further provided a method of Viterbi decoding comprising the steps of: (a) concurrently obtaining history data for paths to two states in a Viterbi trellis; (b) concurrently determining which path segments to two succeeding states survive; and (c) concurrently adding indications of the new surviving path segments to the history data to produce modified history data.

Preferably, step (c) includes removing the oldest element of each history data.

Preferably, the history data is obtained from memory means and the modified history data is written to memory means. More preferably, the history data is always read in the same state order and the addressing of the memory means for writing modified history data follows the same sequence as the read addressing for history data but lags by the maximum number of control clock cycles taken between reading the history data and storing of the resultant modified history data.

According to the present invention, there is further provided a Viterbi decoder comprising first means for concurrently obtaining history data for paths to two states in a Viterbi trellis, second means for concurrently determining which path segments to two succeeding states survive, and third means for concurrently adding indications of the new surviving path segments to the history data to produce modified history data.

Preferably, the third means is configured to remove the oldest element of each history data.

Preferably, there is provided memory means from which the history data is obtained by the first means and memory means to which the modified history data is written by the third means. More preferably, there is provided addressing means for addressing the memory means such that the history data is always read in the same state order and the addressing of the memory means for writing modified history data follows the same sequence as the read addressing for history data but lags by the maximum number of control clock cycles taken between reading the history data and storing of the resultant modified history data.

According to the present invention, there is further provided a method of Viterbi decoding comprising the steps of: (a) identifying a state having the lowest cost path; (b) extracting a bit of a binary sequence representing said path, the bit being sufficiently old for convergence of paths to be reasonably expected; and (c) outputting the extracted bit as a decoded data bit.

In the conventional approach, it is assumed that the paths will converge when traced back a certain number of frames. However, it has been discovered that this assumption cannot be relied upon in practice and that the present invention leads to a reduced error rate.

Preferably, the extracted bit is the oldest bit of said binary sequence.

Preferably, step (a) is performed concurrently with the processing of path metrics.

Preferably, the method includes obtaining two path metrics, the path metrics being associated with states that can be followed by the same set of states; modifying said path metrics with branch metrics to produce a first pair of new path metrics for a first member of said set and a second pair of path metrics for a second member of said set, the members of each pair being derived respectively from said two path metrics; selecting, as surviving path metrics, the lower cost path metric of each pair; selecting the lower cost path metric of a pair of surviving path metrics, storing the lower cost path metric of the selected path metric and the lowest cost previously selected and stored path metric; and, when the path metrics for all states have been processed, extracting and outputting the oldest bit of the binary sequence for the stored path metric.

According to the present invention, there is further provided a Viterbi decoder comprising first means for identifying a state having the lowest cost path, second means for extracting a bit of a binary sequence representing said path, the bit being sufficiently old for convergence of paths to be reasonably expected, and third means for outputting the extracted bit as a decoded data bit.

Preferably, the extracted bit is the oldest bit of said binary sequence.

Preferably, there is provided first processing means for concurrently modifying two path metrics using at least one branch metric to produce a pair of new path metrics for each of two branched to states, and second processing means for concurrently processing pairs of new path metrics, produced by the first processing means, to select from each pair a path metric for a surviving path, and the first means comprises a first comparator for identifying the lower cost path from of a pair of surviving path metrics, a first multiplexer for selecting the path metric for the identified path, a register for storing a path metric, a second comparator for determining the lower cost path from the metric of the identified path and the contents of the register, a second multiplexer for selecting the lower cost path and routing its path metric to the register.

Preferably, there is provided means responsive to the comparators for routing the extracted bit associated with the path metric, making its way to the register, to a 1-bit register and means responsive to the end of path metric processing for all states to output the contents of the 1-bit register as a decoded data bit.

The aspects of the present invention set out above may be employed individually or in any combination of two or more.

The parallel, pipelined architecture employed in aspects of the present invention results in a greatly increased data throughput with only a marginal increase in the number of gates used.

DETAILED DESCRIPTION OF PREFERRED EMBODIMENT

An embodiment of the present invention will now be described, by way of example, with reference to the accompanying drawings.

In the following description, the term "frame" will be used to indicate the processing associated with one convolution code symbol. In the exemplary system described below, each such code symbol comprises a four-bit code, each bit of which is itself represented by a four-bit soft code.

Figure 1:
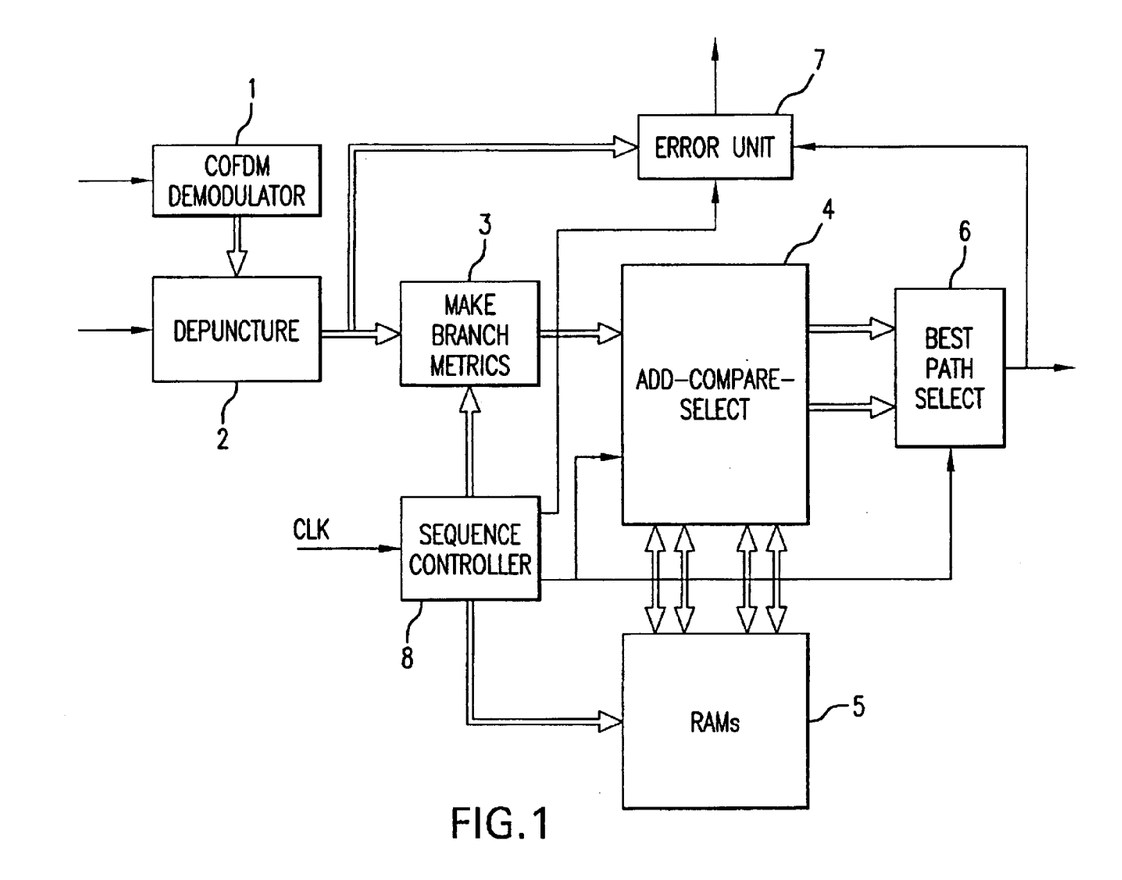
FIG. 1 is a block diagram of a Viterbi decoder according to the present invention.

Referring to FIG. 1, a COFDM (coded orthogonal frequency division modulation) demodulator 1 demodulates received signals and outputs soft decision format codes in a manner well-known in the art. The output of the COFDM demodulator 1 is applied to a depuncturing unit 2.

DAB services are transmitted with varying degrees of puncturing, from no puncturing (four bits transmitted for each bit of data) to heavy puncturing (nine bits transmitted for every eight bits of data). If puncturing is used, it is necessary to reinstate the omitted bits at the decoder. The missing bits are generated by the depuncturing unit 2 using profile data (P) transmitted in each frame. The soft decision format codes output by the depuncturing unit 2 are input to a make branch metrics unit 3.

The output of a convolution coder is a sequence of codes. In the case of DAB, the coder formally has a constraint of seven and four codes are used. The coder is usually implemented as a six stage shift register and an arrangement of exclusive-OR gates for generating four outputs, corresponding respectively to 133, 145, 171 and 133 polynomials.

Each possible combination of coder shift register contents represents a discrete state. In the present case, there are 64 possible states because the most recently input data bit is not used to generate the output codes. When a new data bit is input to the coder, the extant state can change or "branch" to one of two possible new states in dependence on the value of the previously input bit.

The make branch metrics unit 3 determines a distance between the soft decision format codes from the depuncturing unit 2 and the code for each possible new branch, i.e. two for each state. These distances are used to allocate a score to each branch which will be referred to as a "branch metric". The smaller the distance between the soft decision format code and an expected code, the higher the score. A feature of the convolution code used is that the 133 polynomial is duplicated. Consequently, only eight branch metrics actually need to be calculated.

The branch metrics, generated by the make branch metrics unit 3 for the codes output by the depuncturing unit 2, are output to an add-compare-select unit 4.

The add-compare-select unit 4 reads historically derived path metrics, associated respectively with each state, from a RAM block 5 and modifies them using the corresponding branch metrics. The add-compare-select unit 4 also determines which paths to a new state survive.

The add-compare-select unit 4 also maintains a record of the details of surviving paths through the Viterbi trellis ("path data") in the RAM block 5.

The structure and operation of the add-compare-select unit 4 will be described in detail below.

The add-compare-select unit 4 outputs path metric information to a best path unit 6 which determines the best path back through the Viterbi trellis to identify the value of the data bit represented by the code input 72 frames earlier. This value is then output as the output data of the decoder.

The structure and operation of the best path unit 6 will be described in more detail below.

The values output by the best path unit 6 are recoded and compared with the codes output by the depuncturing unit 2 by an error unit 7 to generate a value for the error rate in the received signal.

The operation of the make branch metrics unit 3, the add-compare-select unit 4, the RAM block 5, the best path unit 6, and the error unit 7 are controlled by a sequential controller 8 of conventional construction.

The RAM block 5 comprises four two-port RAMs. Two are 32 by 11 bits for storing path metrics for states respective halves of the Viterbi trellis and two are 32 by 72 bits for storing path data for states in respective halves of the Viterbi trellis. The half of the Viterbi trellis to which a state belongs is determined by the most significant bit of the state's binary representation. The RAM addressing will be described in detail below.

Figure 2:
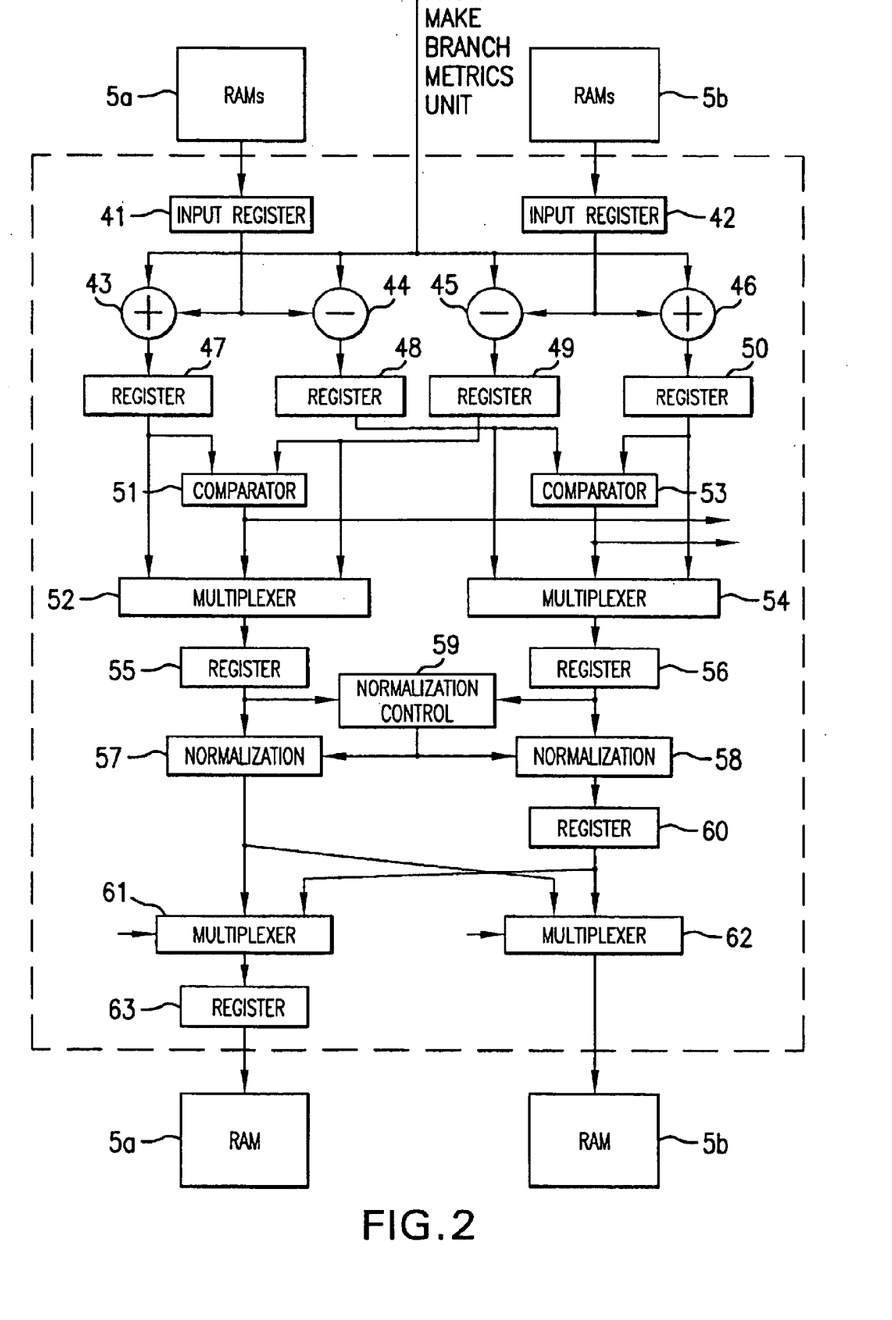
FIG. 2 is a schematic diagram of the path metric processing part of the add-compare-select unit of FIG. 1.

Referring to FIG. 2, the path metric processing part of the add-compare-select unit 4 comprises two parallel, pipelined paths. The inputs to the add-compare-select unit 4 are 11-bit path metrics, i.e. accumulated scores, from the path metrics RAMs 5a, 5b and 11-bit branch metrics from the make branch metrics unit 3.

First and second input registers 41, 42 receive the input path metrics. The output of the first input register 41 is fed to inputs of a first adder 43 and a first subtracter 44. The output of the second input register 42 is fed to inputs of a second adder 46 and a second substracter 45. The input branch metrics are applied to the other inputs of the first and second adders 43, 46 and the first and second subtracters 43, 46. The outputs of the first and second adders 43, 46 and the first and second subtracters 43, 45 are fed respectively to third, fourth, fifth and sixth registers 47, 48, 49, 50.

The outputs of the third and fifth registers 47, 49 are applied to the inputs of a first comparator 51 and also to the data inputs of a first multiplexer 52. The select input of the first multiplexer 52 is coupled to the output of the first comparator 51. The output of the first multiplexer 52 is connected to the input of a seventh register 55.

The outputs of the fourth and sixth registers 47, 49 are applied to the inputs of a second comparator 53 and also to the data inputs of a second multiplexer 54. The select input of the second multiplexer 54 is coupled to the output of the second comparator 52. The output of the second multiplexer 54 is connected to the input of an eighth register 56.

The output of the seventh register 55 is fed to a first normalisation unit 57 and the output of the eighth register 56 is fed to a second normalisation unit 58. The normalisation operations of the normalisation units 57, 58 are controlled by a normalisation control unit 59 which receives the outputs of the seventh and eighth registers 55, 56 as its inputs.

The output of the second normalisation unit 56 is fed to the input of a ninth register 60. The outputs of the first normalisation unit 57 and the ninth register 60 are fed to respective inputs of a third multiplexer 61 and a fourth multiplexer 62. The output of the third multiplexer 61 is connected to the input of a tenth register 63. The 11-bit wide output of the tenth register 63 is connected for writing to the first path metric RAM 5a. The 11-bit wide output of the fourth multiplexer 62 is connected for writing to the second path metric RAM 5b.

The processing of path metrics will now be described. It should be understood that the pipeline structure means that at any given time, the operations described below are being carried out simultaneously for respective frames.

Path metrics for states in respective halves of the Viterbi trellis , e.g. 000001 and 100001 or 011101 and 111101 (the most significant bit determining which half of the Viterbi trellis contains the state), are read from the first and second path metric RAMs 5a, 5b respectively into the first and second registers 41, 42 during a first clock cycle. During the next clock cycle, the contents of the first register 41 are applied to inputs of the first adder 43 and the first subtracter 44 while the current branch metric, from the make branch metric unit, is applied to the other inputs of the first adder 43 and the first subtracter 44. The outputs of the first adder 43 and the first subtracter 44 are latched into the third and fourth registers 47, 48. During the same clock cycle, the contents of the second register 42 are applied to inputs of the second adder 46 and the second subtracter 45 while the current branch metric is applied to the other inputs of the second adder 46 and the second subtracter 45. The outputs of the second adder 46 and the second subtracter 45 are latched into the fifth and sixth registers 47, 48.

At this point, the contents of the third register 47 are the sum of the path metric of a first path through the Viterbi trellis thus far and the branch metric for taking the currently input code as representing a branch in a first direction from the path, the contents of the fourth register 48 are the sum of the path metric of the first path through the Viterbi trellis thus far and the branch metric for taking the currently input code as representing a branch in a second direction from the path, the contents of the fifth register 49 are the sum of the path metric of a second path through the Viterbi trellis thus far and the branch metric for taking the currently input code as representing a branch in the second direction from the path, and the contents of the sixth register 50 is the sum of the path metric of the second path through the Viterbi trellis thus far and the branch metric for taking the currently input code as representing a branch in the first direction from the path.

The contents of the third and fifth registers 47, 49 are path metrics for two paths through the Viterbi trellis to the same state and the contents of the fourth and sixth registers 48, 50 are path metrics for two paths to another state. The Viterbi algorithm provides for the path with the largest path metric (i.e. lowest cost) to survive. For this reason, on the next clock pulse, the contents of the third and fifth registers 47, 49 are fed to the inputs of the first comparator 51. The output of the first comparator 51 indicates which input represents the larger path metric and causes the first multiplexer unit 52 to select its corresponding input which is latched into the seventh register 55. Similarly, the contents of the fourth and sixth registers 48, 50 are fed to the inputs of the second comparator 53. The output of the second comparator 53 indicates which input represents the larger path metric and causes the second multiplexer 54 to select its corresponding input which is then latched into the eighth register 56.

The outputs of the first and second comparators 51, 52 are output to the data path processing part of the add-compare-select unit 4 (see FIG. 3) to indicate the branch directions (1 or 0) of the present surviving paths. The surviving path metrics are not only stored in the path metric RAMs 5a, 5b but also output to the best path unit 6.

It will be assumed at this point that the surviving path metrics are for states in the half of the Viterbi trellis for which the first path metric RAM 5a is used and that the surviving path metrics for the next frame are for states in the other half of the Viterbi trellis. As will be explained below, with reference to the addressing of the RAM block 5, the present surviving path metrics and the following surviving path metrics will be stored at the same addresses in respectively the first and second path metric RAMs 5a, 5b.

In the next clock cycle, the contents of the seventh register 55 are passed through the first normalisation unit 57 and the third multiplexer 61 (under the control of a select signal from the sequential controller 8), and latched into the tenth register 63. At the same time, the latched contents of the eighth register 56 are passed through the second normalisation unit 58 and latched into the ninth register 60.

The ninth and tenth registers 60, 63 buffer the surviving path metrics to be stored in the first path metric RAM 5a to allow the surviving path metrics for the next frame, which are to be stored in the second path metric RAM 5b, to catch up.

In the next clock cycle, the contents of the tenth register 63 are stored in the first path metric RAM 5a, the contents of the ninth register 60 are latched into the tenth register 63, the contents of the seventh register 55 are passed through the first normalisation unit 57 and the fourth multiplexer 62, which is under the control of the sequential controller 8, and stored in the second path metric RAM 5b, and the contents of the eighth register 56 are latched into the ninth register 60. The contents of the ninth and tenth registers 60, 63 are then stored respectively in the second and first path metric RAMs 5b, 5a on the next clock cycle.

At least some path metric values will grow and grow and would soon cause an overflow error. It is necessary, therefore, to periodically trim back the path metrics. This function is performed by the normalisation control unit 59 and the first and second normalisation units 57, 58. The normalisation control unit 59 monitors the surviving path metrics and when a path metric exceeds a threshold value, causes a constant to be subtracted from each new path metric during the next frame.

Figure 3:
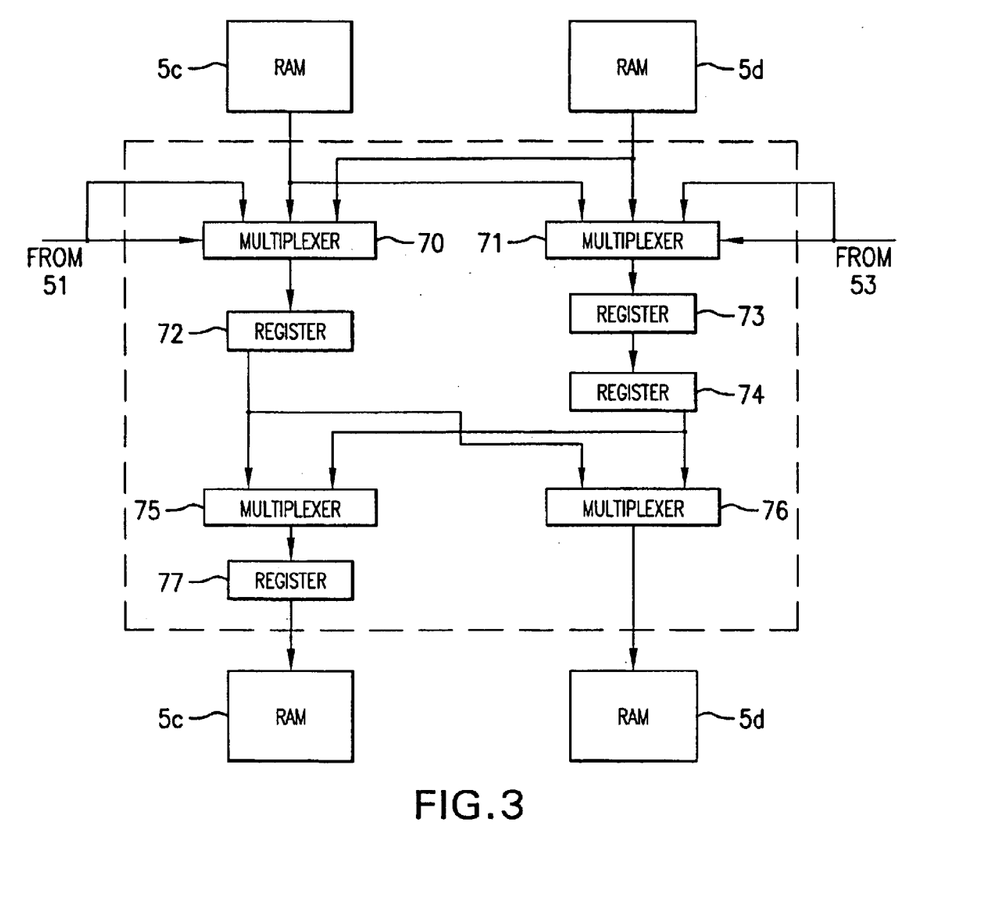
FIG. 3 is a schematic diagram of the path data processing part of the add-compare-select unit of FIG. 1.

Referring to FIG. 3, the path data processing part of the add-compare-select unit 4 comprises first and second multiplexers 70, 71 coupled to receive 71 of the 72 path data bits from the path data RAMs 5c, 5d and branch direction bits from path metric processing part. The select inputs of the first and second multiplexers 70, 71 are coupled respectively to the outputs of the first and second comparators 51, 53 of the path metric processing part of the add-compare-select unit 4 (FIG. 2). The output of the first multiplexer 70 is fed to a first register 72. The output of the second multiplexer 71 is fed to second register 73. The output of the second register 73 is connected to the input of a third register 74.

The output of the third register 74 is connected to one input of a third multiplexer 75 and one input of a fourth multiplexer 76. The output of the first register 72 is connected to the other inputs of the third and fourth multiplexers 75, 76. The output of the fourth register 77 is connected for writing to the first path data RAM 5c. The output of the fourth multiplexer 76 is connected for writing to the second path data RAM 5d. The output of the third multiplexer 75 is fed to a fourth register 77.

The operation of the path data processing part of the add-compare-select unit 4 will now be described. In particular, its operation while the path metric processing part is operating as described above will be described.

In the clock cycle in which the comparators 51, 53 of the path metric processing part of the add-compare-select unit 4 (FIG. 2) produce outputs, the corresponding path data is read from the path data RAMs 5c, 5d and fed to the inputs of the first and second multiplexers 70, 71. If the first comparator 51 determines that the path from a state represented in the first path metric RAM 5a is to survive, the first multiplexer 70 directs the 71 path data bits from the first path data RAM 5c together with a 0 in the least significant bit position into the first register 72. On the other hand, the first multiplexer 70 directs the 71 path data bits from the first path data RAM 5c together with a 1 in the least significant bit position into the first register 72. The second multiplexer 71 processes path data in the same way, but in response to the output of the second comparator 53 of the path metric processing part of the add-compare-select unit 4, and stores the new path data in the second register 73.

In the next clock cycle, the path data stored in the second register 73 is transferred to the third register 74 and the path data stored in the first register 72 is passed through the third multiplexer 75 and latched into the fourth register 77. The third and fourth registers 74, 77 buffer the data to be written to the first path data RAM 5c so that the following path data can be concurrently written to the second path data RAM 5d.

In the next clock cycle, the contents of the fourth register 77 are written to the first path data RAM 5c, the contents of the first register 72 (i.e. path data for the next frame) is written to the second path data RAM 5d, via the fourth multiplexer 76, the contents of the third register 74 are transferred to the fourth register 77 via the third multiplexer 75 and the contents of the second register 73 are transferred to the third register 74. The contents of the fourth and third registers 77, 73 are written respectively to the first and second path data RAMs 5c, 5d in the next clock cycle.

The oldest bits of the path data written to the path data RAMs 5c, 5d are output to the best path unit 6.

Figure 4:
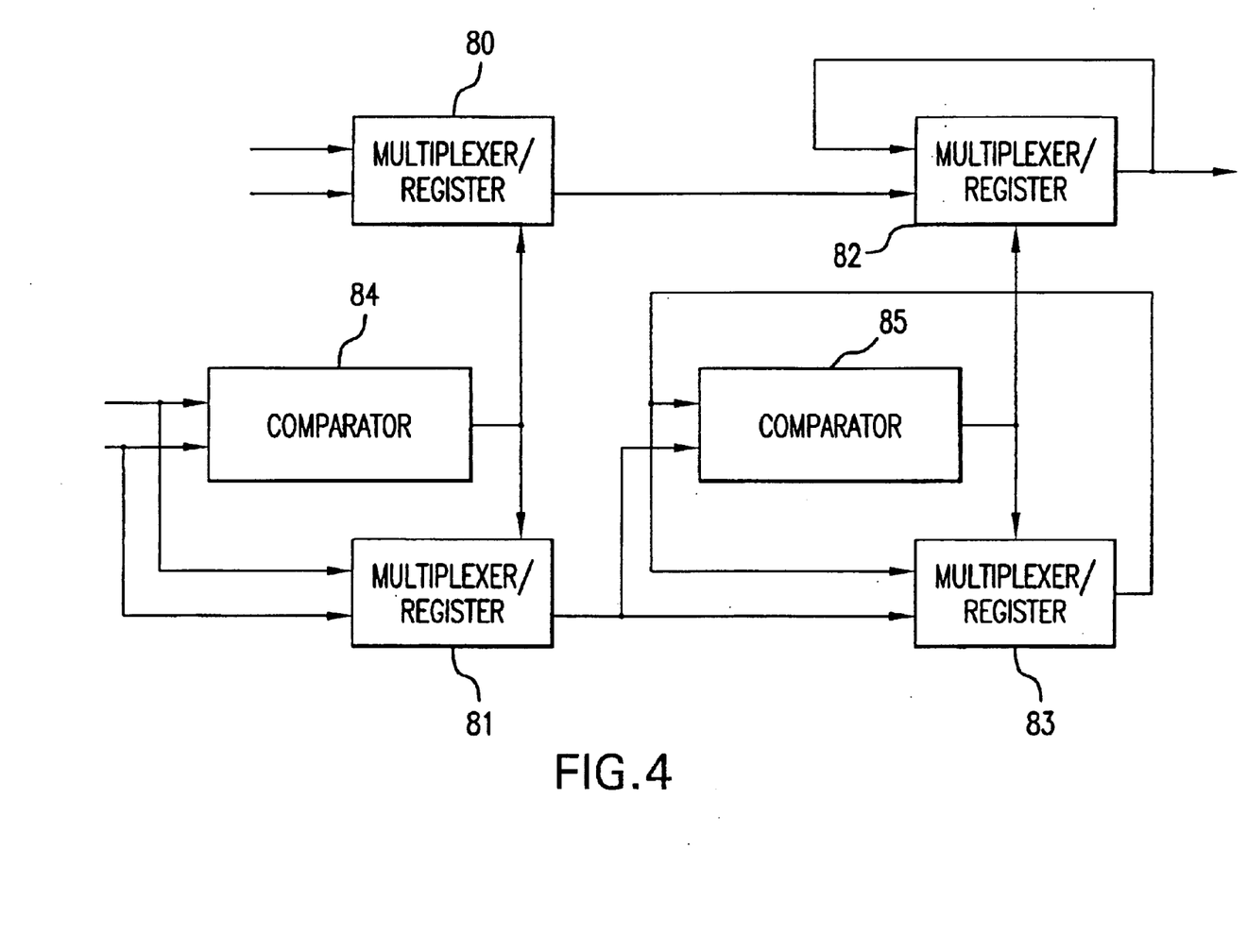
FIG. 4 is a schematic diagram of the best path unit of FIG. 1.

Referring to FIG. 4, the best path unit 6 comprises first, second, third and fourth multiplexer/registers 80, 81, 82, 83 and first and second comparators 84, 85. The first and third multiplexer/registers 80, 82 are one bit wide. The inputs of the first comparator 84 are connected to receive respectively the outputs of the tenth register 63 and the fourth multiplexer 62 of the path metric processing part of the add-compare-select unit 4. The data inputs to the first multiplexer/register 80 are connected to receive respectively the outputs of the fourth register 77 and the fourth multiplexer 76 of the path data processing part of the add-compare-select unit 4. The select input of the first multiplexer/register 80 is connected to the output of the first comparator 84. The data inputs of the second multiplexer/register 81 are connected to receive respectively the outputs of the tenth register 63 and the fourth multiplexer 62 of the path metric processing part of the add-compare-select unit 4. The select input of the second multiplexer/register 81 is connected to the output of the first comparator 84.

One of the inputs of the second comparator 85 is connected to the output of the second multiplexer/register 81 and the other is connected to the output of the fourth multiplexer/register 83, which is also fed back to one of the data inputs of the fourth multiplexer/register 83. The other data input of the fourth multiplexer/register 83 is connected to receive the output of the second multiplexer/register 81. The output of the second comparator 85 is connected to the select inputs of the third and fourth multiplexer/registers 82, 83. The data inputs of the third multiplexer/register 82 are connected respectively to the output of the first multiplexer/register 80 and the third multiplexer/register's own output.

During the processing of each frame the surviving path metric data and the oldest path data bit generated for each state are fed to the best path unit 6. The first comparator 84 compares the concurrently output new path metrics to determine the larger and causes the larger to be latched into the register part of the second multiplexer/register 81. Similarly, the oldest path data bit, associated with the selected path metric, is caused to be latched into the register part of the first multiplexer/register 80. It can be seen that for each pair of path metrics output by the add-compare-select unit 4, the largest is placed in the second multiplexer/register 81 and the associated oldest path data bit is placed in the first multiplexer/register 80.

Concurrently with the operation of the first comparator 84, the second comparator 85 compares the path metric placed in the second multiplexer/register 81 during the processing of the previous frame with the path metric held in the fourth multiplexer/register 83. The output of the second comparator 85 indicates which of the input path metrics is the larger and causes this to be latched into the register part of the fourth multiplexer/register 84. Thus, the fourth multiplexer/register 84 always holds the largest path metric that has been applied to the second comparator 85 during the present frame. The output of the second comparator 85, acting on the select input of the third multiplexer/register 82, causes the oldest path data bit, associated with the path metric in the fourth multiplexer/register 83, to be held in the third multiplexer/register 82.

When processing of the current frame is complete, the path data bit in the third multiplexer/register 82 is read out as a decoded data bit.

The addressing of the RAM block 5 will now be described.

As described above, the add-compare-select unit 4 processes 32 pairs of path metric data for each frame. The surviving path metrics are stored back in the path metric data RAMs 5a, 5b in such a way that data is not overwritten before it can be used.

TABLE

| position in frame | state | path metrics read address J = 0 | path data read address J = 0 | path metrics write address J = 0 | path metrics read address J = 1 | path metrics read address J = 2 | path metrics read address J = 3 | path metrics read address J = 4 |
|---|---|---|---|---|---|---|---|---|
| 00 | 00 | 00 | * | * | 00 | 00 | 00 | 00 |
| 01 | 10 | 10 | * |  | 08 | 04 | 02 | 01 |
| 02 | 01 | 01 | 00 | * | 10 | 08 | 04 | 02 |
| 03 | 11 | 11 | 10 |  | 18 | 0C | 06 | 03 |
| 04 | 02 | 02 | 01 | 00/10 | 01 | 10 | 08 | 04 |
| 05 | 12 | 12 | 11 |  | 09 | 14 | 0A | 05 |
| 06 | 03 | 03 | 02 | 01/11 | 11 | 18 | 0C | 06 |
| 07 | 13 | 13 | 12 |  | 19 | 1C | 0E | 07 |
| 08 | 04 | 04 | 03 | 02/12 | 02 | 01 | 10 | 08 |
| 09 | 14 | 14 | 13 |  | 0A | 05 | 12 | 09 |
| 0A | 05 | 05 | 04 | 03/13 | 12 | 09 | 14 | 0A |
| 0B | 15 | 15 | 14 |  | 1A | 0D | 16 | 0B |
| 0C | 06 | 06 | 05 | 04/14 | 03 | 11 | 18 | 0C |
| 0D | 16 | 16 | 15 |  | 0B | 15 | 1A | 0D |
| 0E | 07 | 07 | 06 | 05/15 | 13 | 19 | 1C | 0E |
| 0F | 17 | 17 | 16 |  | 1B | 1D | 1E | 0F |
| 10 | 08 | 08 | 07 | 06/16 | 04 | 02 | 01 | 10 |
| 11 | 18 | 18 | 17 |  | 0C | 06 | 03 | 11 |
| 12 | 09 | 09 | 08 | 07/17 | 14 | 0A | 05 | 12 |
| 13 | 19 | 19 | 18 |  | 1C | 0E | 07 | 13 |
| 14 | 0A | 0A | 09 | 08/18 | 05 | 12 | 09 | 14 |
| 15 | 1A | 1A | 19 |  | 0D | 16 | 0B | 15 |
| 16 | 0B | 0B | 0A | 09/19 | 15 | 1A | 0D | 16 |
| 17 | 1B | 1B | 1A |  | 1D | 1E | 0F | 17 |
| 18 | 0C | 0C | 0B | 0A/1A | 06 | 03 | 11 | 18 |
| 19 | 1C | 1C | 1B |  | 0E | 07 | 13 | 19 |
| 1A | 0D | 0D | 0C | 0B/1B | 16 | 0B | 15 | 1A |
| 1B | 1D | 1D | 1C |  | 1E | 0F | 17 | 1B |
| 1C | 0E | 0E | 0D | 0C/1C | 07 | 13 | 19 | 1C |
| 1D | 1E | 1E | 1D |  | 0F | 17 | 1B | 1D |
| 1E | 0F | 0F | 0E | 0D/1D | 17 | 1B | 1D | 1E |
| 1F | 1F | 1F | 1E |  | 1F | 1F | 1F | 1F |
| 00 | * | * | 0F | 0E/1E |  |  |  |  |
| 01 | * | * | 1F |  |  |  |  |  |
| 02 | * | * | * | 0F/1F |  |  |  |  |
| 03 | * | * | * |  |  |  |  |  |

J is the frame index of i.e. J=0 for the first frame, J=1 for the second frame etc. The pattern repeats every five frames. Thus, the address sequence used when J=5 is the same as that used when J=0.

The above table illustrates the memory addressing employed in the present embodiment.

Referring to the Table, the first states to be processed, when J=0, are 0 00000 and 1 00000, represented by 00 in the Table. The path metrics for these states are concurrently read from the 00HEX locations of the first and second path metric RAMs 5a, 5b (FIG. 2) respectively. Both of these states branch to states 0 00000 and 0 00001, the surviving path metrics for both of which will be stored in the first path metric RAM 5a because the most significant bit in the case of each state is 0.

The next states to be processed are 0 10000 and 1 10000, represented by 10 in the Table. Both of these states branch to states 1 00000 and 1 00001. The 1 in the most significant bit position means that the surviving path metrics for these states will be stored in the second path metric RAM 5b. It can be seen that the five least significant bits are the same as those of the states branched to from states 0 00000 and 1 00000. Consequently, the surviving path metrics produced for the first two stages are stored in corresponding positions in the first and second path metric RAMs 5a, 5b respectively. From Table 1, it can be seen that the x 00000 path metrics are stored at the 00HEX locations, four clock cycles after reading of the 0 00000 and 1 00000 path metrics, and the x 00001 values are stored in the 10HEX locations in the next clock cycle. This pattern of operation is repeated until the path metrics for all of the states have been processed. For instance, the path metrics for the 0 01000 (08), 101000 (08), 0 11000 (18) and 1 11000 (18) states are processed to produce surviving path metrics for states 0 10000 and 1 10000, stored at the 08HEX locations in the first and second path metric RAMs 5a, 5b, and 0 10001 and 1 10001, stored at the 18HEX locations in the first and second path metric RAMs 5a, 5b.

When J=1, the path metrics for the states 0 00000 and 1 00000 are first processed. The path metrics for these states are read from the 00HEX locations in the first and second path metric RAMs 5a, 5b where they were stored in the previous frame. Next, the path metrics for the states 0 10000 and 1 10000 are processed. The path metrics for these states are not read from the 10HEX locations as before but from the 08HEX locations where these path metrics were stored in the previous frame.

Thus for each frame, the memory addresses are shuffled but the path metrics are always read out in the same state order.

The reading of path data from the path data RAMs 5c, 5d uses the same addressing pattern as the reading of the path metrics but delayed by two clock cycles. The new path data is stored in the path data RAMs 5c, 5d at the same time as the surviving path metrics are stored, using the same addresses.

The embodiment described above has been selected to enable the reader to readily understand its operation. A preferred method of implementing the present invention is to define the function of the above-described embodiment using a hardware definition language and compile it using a silicon compiler to optimise the number of gates required to produce the desired functionality.

What is claimed is:

1. A Viterbi decoder including:
   memory means comprising two-port RAM means for storing Viterbi decoder data, said data comprising path metrics and/or path history data;
   clocked processing means for producing new Viterbi decoder data from Viterbi decoder data, read from the memory means, and a signal being decoded; and
   addressing means for generating a first address signal for addressing locations in said two-port RAM means in a predetermined sequence so that Viterbi decoder data is read from the two-port RAM means in the same state order during decoding of a signal, and for generating a second address signal for addressing locations in said two-port RAM means in the same sequence as the first address signal,
   wherein:
      both the first and second address signals are generated in one clock cycle,
      new Viterbi data is written to the locations addressed by the second address signal concurrently with Viterbi data being read from the locations addressed by the second address signal, and
      the second address signal lags the first address signal by the maximum number of control clock cycles required between reading Viterbi data and the resultant new Viterbi data.

2. A decoder according to claim 1, wherein the memory means comprised first and second two-port RAM means and the addressing means is arranged for reading two path metrics or history data for two paths in the same trellis concurrently from respectively the first and second RAM means.

3. A decoder according to claim 2, wherein an address signal applied to the first RAM means is concurrently applied to the second RAM means.

4. A decoder according to claim 1, wherein the memory comprises four two-port RAM means, two of which store path metric data and two of which store path history data.

5. A method of Viterbi decoding comprising the steps of:
   (a) obtaining two path metrics, the path metrics being associated with states that can be followed by the same set of states;
   (b) modifying said path metrics with branch metrics to produce a first pair of new path metrics for a first member of said set and a second pair of path metrics for a second member of said set, the members of each pair derived respectively from said two path metrics; and
   (c) selecting the path metric of the lower cost of each pair, wherein step (a) is performed at the same time as step (b) is being performed in respect of two path metrics obtained by an earlier performance of step (a) and wherein the reading of path metrics is arranged such that a first performance of step (a) and a second immediately following performance of step (a) leads to a pair of selected path metrics to be stored in one of a RAM means and a pair of selected path metrics to be stored in the other of a RAM means, and each member of one of the pairs of selected path metrics is stored concurrently with a member of the other pair of selected path metrics.

6. A method according to claim 5, wherein step (b) comprises adding a branch metric to each of said two path metrics and subtracting the same branch metric from each of said two path metrics.

7. A method according to claim 5, wherein said selected path metrics are stored in a memory means from which at least one of said two path metrics was read.

8. A method according to claim 7, wherein selected path metrics are written to respective RAM means in dependence on the most significant bits of the binary representations of the states to which the selected path metrics relate.

9. A Viterbi decoder comprising:
   first processing means for concurrently modifying two path metrics for states in respective halves of a Viterbi trellis using at least one branch metric to produce a pair of new path metrics for each of two branched to states, said two path metrics differing from one another by the state of one bit, and
   second processing means for concurrently processing pairs of modified path metrics, produced by the first processing means, to select from each pair a path metric for a surviving path,
   wherein the first and second processing means operate at the same time with the second processing means processing modified path metrics produced by the first processing means earlier while the first processing means is processing the two path metrics that succeeded the path metrics which were modified to produce the modified path metrics being processed by the second processing means,
   wherein the first processing means comprises a first adder for adding a branch metric to a first path metric read from the memory means, a second adder for adding a branch metric to a second path metric read from a memory means, a first subtracter for subtracting a branch metric from said first path metric and a second subtracter for subtracting a branch metric from said second path metric.

10. A decoder according to claim 9, including memory means for storing path metrics and addressing means for reading two path metrics from the memory means, the path metrics being associated with states that can be followed by the same set of states, wherein the first processing means is arranged to process path metrics read from the memory means by means of the addressing means.

11. A decoder according to claim 9, wherein the same branch metric is applied to the first and second adders and the first and second subtracters.

12. A decoder according to claim 10, wherein the second processing means is arranged to output said selected path metrics to the memory means.

13. A decoder according to claim 12, wherein the memory means comprises first and second RAM means and the second processing means is arranged such that said selected path metrics are output to one or other of the RAM means in dependence on the values of the most significant bits of the binary representations of their associated states.

14. A decoder according to claim 13, wherein the first and second RAM means comprise two-port RAM means and the addressing means is arranged for reading said two path metrics from respectively the first and second RAM means.

15. A decoder according to claim 14, wherein an address signal applied to the first RAM means is concurrently applied to the second RAM means.

16. A decoder according to claim 10, wherein the addressing means is configured such that path metrics are always read from the memory means in the same order and the addressing of the memory means for writing surviving path metrics follows the same sequence as the read addressing but lags by the maximum number of control clock cycles taken between reading two path metrics and storing of the resultant surviving path metrics.

17. A Viterbi decoder comprising:
- first processing means for concurrently modifying two path metrics using at least one branch metric to produce a pair of new path metrics for each of two branched to states;
- second processing means for concurrently processing pairs of new path metrics, produced by the first processing means, to select from each pair a path metric for a surviving path;
- a first comparator for identifying the lower cost path of a pair of surviving paths;
- a first multiplexer for selecting the path metric of the identified path;
- a register for storing a path metric;
- a second comparator for determining the lower cost path of the identified path and the path represented by the contents of the register;
- a second multiplexer for selecting the determined lower cost path and routing its path metric to the register;
- bit selection means for extracting a bit of a binary sequence representing said path, the bit being sufficiently old for convergence of paths to be reasonably expected; and
- output means for outputting the extracted bit as a decoded data bit.

18. A decoder according to claim 17, including means responsive to the comparators for routing the extracted bit associated with the path metric, making its way to the register, to a 1-bit register and means responsive to the end of path metric processing for all states to output the contents of the 1-bit register as a decoded data bit.

* * * * *